United States Patent [19]
Stuhlfelner

[11] Patent Number: 6,005,953
[45] Date of Patent: *Dec. 21, 1999

[54] CIRCUIT ARRANGEMENT FOR IMPROVING THE SIGNAL-TO-NOISE RATIO

[75] Inventor: Friedbert Stuhlfelner, Leiblfing, Germany

[73] Assignee: Nokia Technology GmbH, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/766,855

[22] Filed: Dec. 13, 1996

[30] Foreign Application Priority Data

Dec. 16, 1995 [DE] Germany .......... 195 47 093

[51] Int. Cl.$^6$ .................................. H04B 15/00
[52] U.S. Cl. .................. 381/94.3; 381/107; 381/56
[58] Field of Search .................. 381/102, 103, 381/28, 56, 94.2, 94.3, 94.5, 104, 57, 58, 107

[56] References Cited

U.S. PATENT DOCUMENTS

| | | | |
|---|---|---|---|
| 4,641,361 | 2/1987 | Rosback | 381/103 |
| 4,852,175 | 7/1989 | Kates . | |
| 5,027,410 | 6/1991 | Williamson et al. . | |
| 5,083,312 | 1/1992 | Newton et al. . | |
| 5,363,062 | 11/1994 | Nebuloni et al. | 381/120 |
| 5,528,695 | 6/1996 | Klippel | 381/106 |
| 5,606,625 | 2/1997 | Dallavalle et al. | 381/104 |

FOREIGN PATENT DOCUMENTS

| | | |
|---|---|---|
| 0 599 132 A2 | of 0000 | European Pat. Off. . |
| 2809216 | 11/1978 | Germany . |
| 2219899 | 11/1983 | Germany . |
| 4210707 | 4/1993 | Germany . |
| 3802903 | 9/1993 | Germany . |

OTHER PUBLICATIONS

European Patent Office Search Report dated Jan. 7, 1999 corresponding to EP 96 11 9341.

*Primary Examiner*—Ping Lee
*Attorney, Agent, or Firm*—Ware, Fressola, Van Der Sluys & Adolphson LLP

[57] ABSTRACT

In a new circuit arrangement for improving the signal-to-noise ratio, the entire audible frequency spectrum is divided into several abutting frequency channels. Each channel supplies the respective signal part in delayed form to an amplifier with controllable amplification. The amplifier's amplification is adjusted as a function of a comparator, so that when the audio frequency signal is below a threshold value during a specified time, the amplification of the controllable amplifier is gradually decreased to the lowest amplification value. Vice versa, when the useful signal again exceeds the threshold value, the amplification is gradually controlled upward to a maximum value.

36 Claims, 2 Drawing Sheets

$G^* = \text{gain}(t+\Delta t) = \text{scaler} * (\text{gain}(t) + \text{const.})$     $k = \exp(-t_{SAMPLE} / t_{INTEGRATION})$ $\text{scaler} = \exp(-t_{SAMPLE} / t_{SCALER})$

CIRCUIT ARRANGEMENT FOR IMPROVING THE SIGNAL-TO-NOISE RATIO

TECHNICAL FIELD

The present invention relates to circuits for improving the signal-to-noise ratio of audio events.

BACKGROUND OF THE INVENTION

To record or amplify sound events, it is first necessary to convert the sound events into an electrical signal by means of an electro-acoustical converter. The thus gained electrical signal is either amplified further and converted back by another electro-acoustical converter so that the amplified sound signal can be recovered, or it is first stored temporarily in a data carrier before it is converted back into a sound signal.

The electrical channel contained between the two signal converters changes the signal inasmuch as it adds at least some noise to the signal. On the one hand the noise is composed of thermal noise from the structural units, and therefore depends exclusively on temperature when an internal resistance is specified, and on the quantization noise if the electrical signal is converted or reconverted from the analog to the digital form. The signal amplitude of the noise signal cited last is also independent of the amplitude of the useful signal or the audio signal.

The components of the noise signal do not affect the ear as long as they remain significantly below the amplitude of the useful signal. The ear has the ability of fading out signals if their amplitude remains clearly below that of a signal with greater amplitude. Aside from its dependence on amplitude, this fade-out effect is frequency-dependent as well.

Many attempts have been made for that reason in the past to utilize this property of the human hearing, in order to subjectively improve the signal-to-noise ratio.

One of the oldest methods for the subjective improvement of the signal-to-noise ratio consists in dividing the audio-frequency into two channels, where the frequency limit is about 8 kHz, and to reduce the amplification in the channel with the higher frequency jump to zero when the useful signal therein falls below a predetermined threshold.

The unpleasant side effect of this comparatively very simple circuit rests in the significant deterioration of the tone quality, because many overtones occur in the frequency range above 8 kHz, which are uniformly cut off with this method.

Another method which also operates with only two channels, wherein the channel with the higher frequency is affected, is described in the essay "The SSM 2000 HUSH Noise Reduction System" from Analog Devices. This system operates with a variable limiting value which, when exceeded, also controls the high-frequency channel disturbed by the noise.

This system also affects the tone quality audibly in an undesired manner, aside from the fact that pumping effects can occur if the transient period is not fast enough.

With the noise filter according to U.S. Pat. No. 3,803,357 the lower and the upper frequency ranges are transmitted without change, while the middle frequency range is assigned to a multichannel system. This multichannel system contains a number of narrow-band band-pass filters which cover the entire frequency range between the low-pass and the high-pass filter. Each of the narrow-band band-pass filters is followed by a linear amplifier, whose amplification ratio is adjustable. The control of the amplification takes place with the help of a noise tracker which samples the composite signal at the input of all band-pass filters, and equally controls all of the narrow-band channels.

Control of the amplification in the known system includes defining a gap in the vicinity of the zero passage of the audio signal, during which the signal is zero at the output. In this way input signals falling within this gap are not amplified. Sinusoidal and sine-shaped signals whose peak-to-peak amplitude is greater than this dead zone are allowed to pass, but change into a clear step or a bend because of the missing amplification in the vicinity of the zero passage. The non-linear distortion created in this manner is compensated by a further narrow-band filter at the output of the amplifier.

The cost is comparatively high and the system furthermore produces additional harmonics which become noticeable as an increased disturbance factor, similar to push-pull amplifier stages with transitional distortions.

A further problem with this system are the transient effects, which are known to last longer the narrower the band of the filter is. The results are transitional distortions which are just as undesirable.

U.S. Pat. No. 5,067,157 describes a noise suppression system wherein the audio signal is also divided into several narrow-band channels, and the respective channel is switched on or off as a function of amplitude of the channel signal.

Such a hard switching system tends to have audible pumping effects.

SUMMARY OF THE INVENTION

Starting from this point, it is the task of the invention to create a new circuit arrangement for improving the signal-to-noise ratio, which exhibits no audible pumping effects.

The new form of control achieves an improvement both when the controlled channel transmits the entire audible frequency spectrum, and with arrangements wherein the audible frequency spectrum is divided into several individual channels, where one of the channels at least is equipped with the new control. The best results are normally obtained when the spectrum is divided into several channels. The single channel variety represents a special variety of the dynamic compression or expansion insofar as it improves the subjectively audible signal-to-noise ratio.

Pumping effects are suppressed in the new system by combining a series of measures. One of the measures consists in detecting the level in the respective channel during a predetermined time, which already balances short-term changes in the signal amplitude to a certain degree. A further measure that prevents pumping consists in not changing the amplification abruptly when the signal level which is averaged over a longer periodic time falls below the switching threshold, but letting the amplification instead run exponentially against a smallest value, starting from its maximum value. In the inverse case, the respective channel is not immediately driven again with amplification number 'one' when the signal level reaches a value that lies above the switching threshold. In this case as well, the amplification is quickly but not jumpingly controlled upward from its smallest value back to the maximum value, for example amplification number 'one'.

With given analog-digital converters this makes it furthermore possible to either improve the subjective signal-to-noise ratio, or to use an analog-digital converter for the same requirements of the subjective signal-to-noise ratio, which exhibits a smaller number of increments, i.e. an analog-digital converter in which the quantization jump is larger and therefore the quantization noise itself is greater. The above-mentioned measure allows the subjective signal-to-noise ratio to be reduced to values like those corresponding to an analog-digital converter with a smaller quantization jump.

A system that is particularly advantageous from the audio-physiological point of view is obtained when the respective channel behaves apparently non-causally within a specified system time. This means that the system already knows almost at instant $t_0$ which event will take place at instant $t_{-n}$. The control thus becomes a foresighted control and enables the up and down control of the amplification even before the event affecting the control or the audio signal has actually taken place.

Such an apparently non-causal system behavior can be achieved when the measuring means are arranged before the signal amplification means with respect to the audio signal flow. The delay time of the amplification means can thereby be utilized to produce an apparently non-causal system behavior with the help of the thus obtained forward control.

A forward adjustment or control considering a longer period of time is obtained if the audio signal flow contains delay means.

The transition during the amplification and the possible distortions caused thereby can be reduced to an inaudible minimum if the amplification of the signal amplification means is changed according to an e- function.

A gradually increasing or decreasing amplification is attained when the control means exhibit the behavior of an integrator with exponential characteristics.

Using the new circuit arrangement is particularly advantageous when the audio signal part is present as a digitalized signal at the input of the level measuring means.

The circuit arrangement is simple to implement in a digital processor, wherein both the level measuring means and the signal amplification means as well as the comparison means and the control means are programs controlling the operation of the digital processor which are stored within the digital processor.

The computation effort can be reduced if the digital processor is equipped with solid-state arithmetic processor and during the computation has the ability of selectively not computing numbers which are smaller or larger than a specified numerical value. This allows realization of maximum amplification (amplification number 'one') or minimum amplification in a simple way, without additional computing operations.

The computation effort for calculating the signal level becomes very small when the program determines the signal level in the respective channel in accordance with the following equation:

$$\text{Level}_{(t+\Delta t)} = k * \text{level}_{(t)} + (1-k) * |\text{audio}_t|,$$

where:

$k = \exp(-t_{sample}/t_{integration})$ $t_{sample}$ = time distance between two sampling values $t_{integration}$ = integration time constant $\text{audio}_t$ = amplitude of the audio signal part at time t.

As can be seen, only one multiplication and one addition are required per sampling value. All other parameters of the equation can be determined previously by computation and do not need to be computed during the actual signal processing.

The computation of the amplification in the respective channel effectively takes place in accordance with the following equation:

$$\text{Gain}_{(t+\Delta t)} \text{scaler} * (\text{gain}_{(t)} + \text{const.}),$$

where:

scaler = $\exp(-t_{sample}/t_{scaler})$ $t_{sample}$ = time distance between two sampling values $t_{scaler}$ = integration time constant $\text{gain}_t$ = amplification factor at time t const = $(1/\text{scaler}-1) *$ minimum amplification.

Only one addition and one multiplication are required in this case as well, so that the computation of the required real time signals can be performed by means of comparatively slow digital processors.

BRIEF DESCRIPTION OF THE DRAWINGS

The drawing illustrates a configuration example of the subject of the invention, where.

BEST MODE FOR CARRYING OUT THE INVENTION

Figure 1:
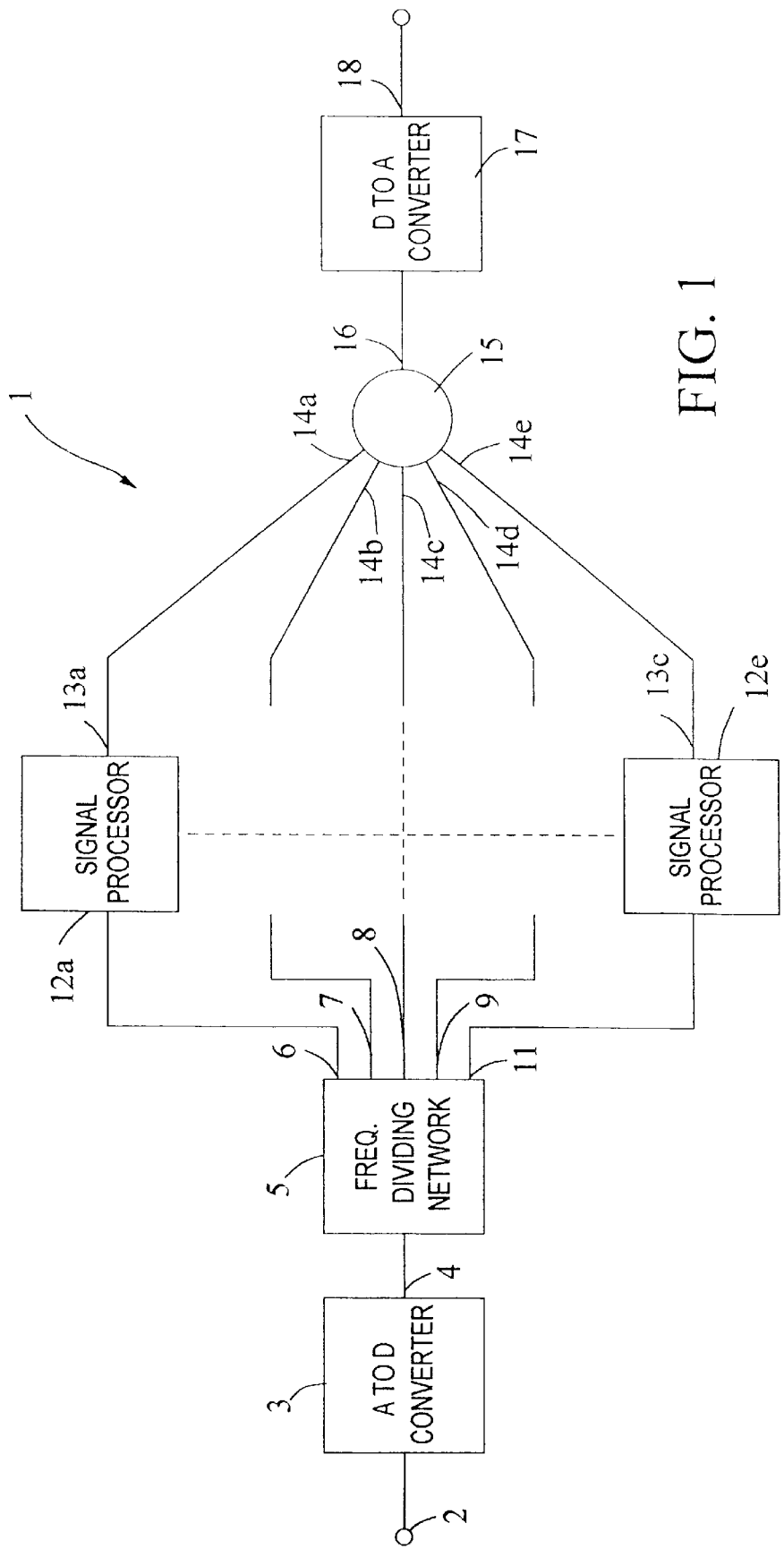
FIG. 1 is a block diagram of the entire circuit arrangement for processing audio signals.

FIG. 1 illustrates a section of an audio installation insofar as this is required to understand the invention. The audio circuit 1 in FIG. 1 has an audio signal input 2 to which an electrical audio signal can be fed, which can come from a microphone or from any storage medium. The signal fed to input 2 represents an analog signal for example, which is converted by a downstream analog-digital converter 3 whose input represents input 2.

The analog-digital converter 3 supplies the audio signal in digitalized form at its output 4. From here it goes to a circuit block 5 which has the function of a frequency-dividing network with, for example, five outputs 6, 7, 8, 9 and 11. In circuit block 5 the audible frequency spectrum between 30 Hz and 20 kHz is divided into five frequency bands. For example, at connection 6 the spectrum extends from 30 Hz to 110 Hz, the frequency range at output 7 from 110 Hz to 440 Hz, the audio signal at the output 8 is between 440 Hz and 1484 Hz, while output 8 provides the audio signal frequency spectrum in the range between 1484 and 5448 Hz and finally output 11 provides the rest of the audio frequency spectrum to 20 kHz.

Of course, if the circuit block 5 is located after the analog-digital converter 3, it must not be considered as a frequency-dividing network configured in a hardware-like manner, but that the circuit block 5 is rather a part of a program in a digital processor which breaks up the digitalized audio signal into its frequency parts by means of known algorithms. In this way the outputs 6 . . . 11 are virtual outputs of part of a program which runs in a digital processor and produces the audio signal parts that fall into the respective frequency ranges from the audio signal at the input 2. The audio signal parts are digital signals in this case as well.

A circuit block 12a . . . 12e representing its own channel is connected to each output 6 . . . 11. Each one of channels 12a . . . 12e processes the audio signal part of the respective frequency range in the manner described below, after which the processed audio signal parts that were delivered to outputs 13a . . . 13e are fed to a summing circuit 15 which assembles the processed audio signal parts into the noise-reduced audio signal. The summing circuit 15 contains an output 16 which is connected to an input of a digital-analog converter 17, whose output 18 produces the analog signal which is suitable for reproduction via a loudspeaker.

Channels 12a . . . 12e are preferably also program parts running in the digital processor. They can also be represented as circuit blocks since they perform functions that are equivalent to those of circuit blocks. The internal construction of channels 12a . . . 12e is the same so that explaining one of channels 12 as an example is sufficient.

Figure 2:
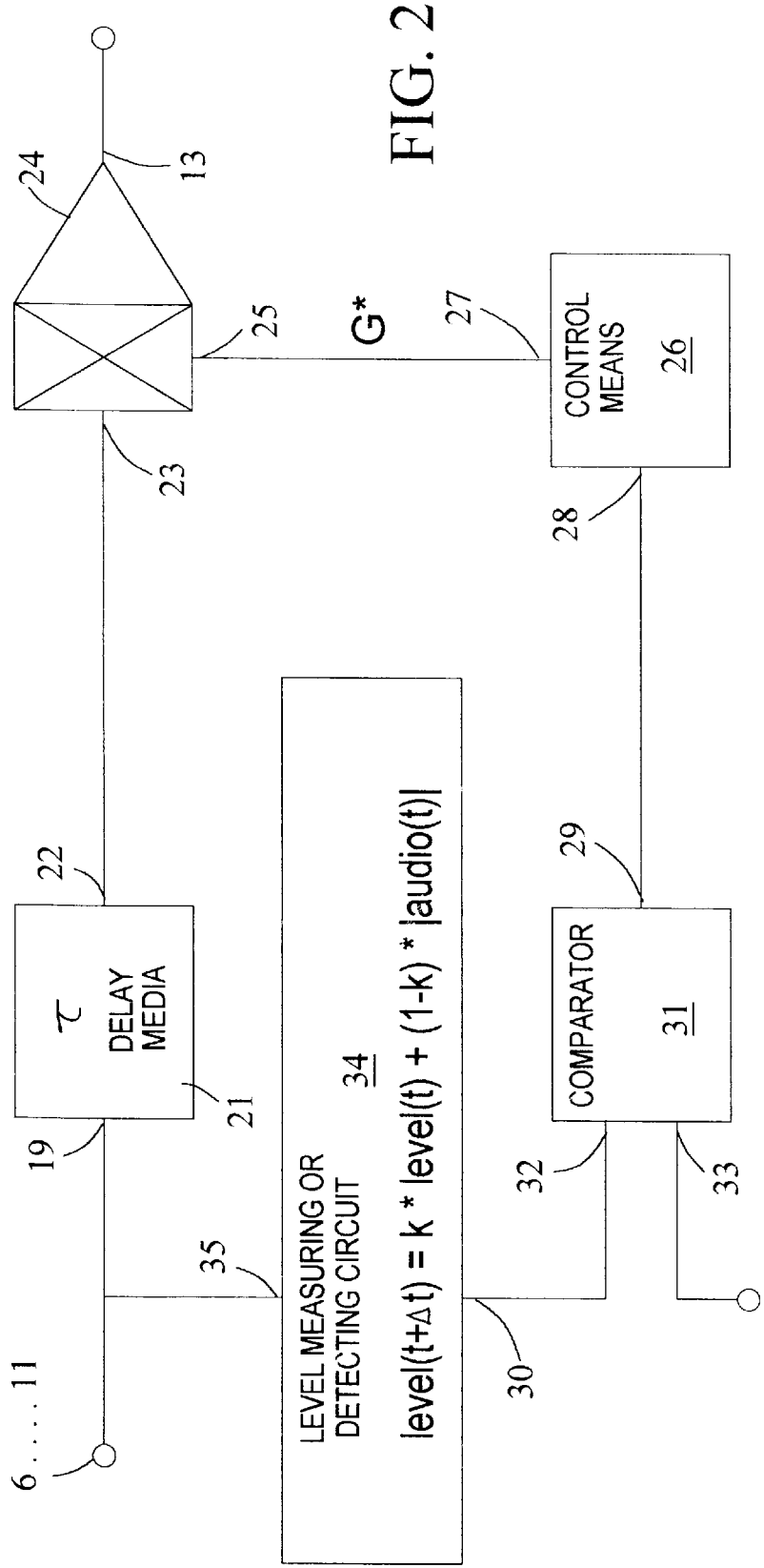
FIG. 2 is a block diagram of one of the channels of the circuit arrangement in FIG. 1.

As seen in FIG. 2, the digitalized audio signal part coming from the pertinent output 6 . . . 11 reaches an input 19 of delay media 21. At that point the audio signal part is delayed by a fixed system running time τ and is then supplied to an output 22. From here the audio signal part goes to an input 23 of an amplifier 24 with controllable amplification, whose output represents output 13.

The controllable amplifier 24 has a control input 25 via which it receives an amplification signal composed of control means 26. The control means 26 provides a signal at its output 27 which behaves like an analog signal, even though it is digitalized. The control means is controlled at its input 28 by a digital signal which recognizes only two signal conditions, and comes from an output 29 of a comparator 31 with two inputs 32 and 33. A reference or threshold value is fed to input 33, while input 32 receives a level signal from an output 30 of a level measuring or detecting circuit 34, whose input 35 is again connected to the pertinent output 6 . . . 11 of the circuit block 5 which acts as the frequency-dividing network.

As already mentioned, circuit blocks 21, 24, 26, 31, 34 are components of a digital processor or program parts which run in the digital processor. Their function is as follows:

Because of the digitalization of the analog audio signal by the analog-digital converter 3 and the subsequent frequency analysis, each input 19 and input 35 receives bit sequences forming a word whose value corresponds to the amplitude of the audio signal part. The time interval of successive binary words is equal to the sampling rate of the analog-digital converter 3. With an upper frequency limit of 20 kHz, the maximum time interval is 25 μsec.

Each of the entered binary numbers is sequentially delayed in the delay media 21 by the fixed delay time τ, so that one and the same binary word with the delay time τ appears at output 22. In parallel to the delaying by the delay media 21, the level measuring means at 34 determine the level of the audio signal part in the respective channel 12. The determination of the level takes place in accordance with the following equation:

$$\text{level}_{(t+\Delta t)} = k * \text{level}_{(t)} + (1-k) * |\text{audio}_t|,$$

where:

$k = \exp(-t_{sample}/t_{integration})$ $t_{sample}$ = time distance between two sampling values $t_{integration}$ = integration time constant $\text{audio}_t$ = amplitude of the audio signal part at time t.

As can easily be seen, the past is also considered with decreasing weighting when the level is determined.

The thus obtained sliding $\text{level}_t$ signal reaches the comparator 31, where it is compared to a fixed or a computed reference value. If the $\text{level}_t$ signal exceeds the reference value, it is a sign of a sufficient signal-to-noise ratio, while falling short of the reference value signifies that the signal-to-noise ratio detrimentally affects the audio impression.

For a further description it must be assumed that the comparator 31 provides a high signal at its output 29 when the $\text{level}_t$ signal exceeds the limit value, and changes it to low as soon as the level; signal falls below the reference value.

The downstream control means 26 evaluate this signal in a way so as to compute the amplification of amplifier 34 with controllable amplification in accordance with the following equation:

$$\text{gain}_{(t+\Delta t)} = \text{scaler} * (\text{gain}_{(t)} + \text{const.}),$$

where:

$\text{scaler} = \exp(-t_{sample}/t_{scaler})$ $t_{sample}$ = time distance between two sampling values $t_{scaler}$ = integration time constant $\text{gain}_t$ = amplification factor at time t $\text{const} = (1/\text{scaler}-1) * \text{minimum amplification}.$ The selected digital processor operates with fixed-point arithmetic and has the ability to autonomously limit the result of computation operations to a respective maximum or a minimum value, without requiring additional comparison operations. The value $\text{gain}_t$ is therefore autonomously restricted by the digital processor between the maximum value which corresponds to amplification number 'one', and the minimum value which corresponds to the minimum amplification. All intermediate values between them are permissible in accordance with the register width. In this way the result of the integration cannot exceed beyond all the limits nor can it be of any small size either.

The amplification signal obtained in this manner is used to multiply the audio signal part coming from the output 22.

The following consequences result from the above equations:

When the $\text{level}_t$ signal has exceeded the limit value for a sufficiently long time, the amplification control signal that was computed by the control means 26 reaches its maximum value which corresponds to amplification number 'one' and means that the audio signal part has passed through the delay means 21 and the amplifier 34 without weakening. If it is assumed that starting from this situation the signal level decreases gradually or suddenly in the respective audio-frequency range, the $\text{level}_t$ signal will decrease during that time in accordance with the integration time constants and whenever it falls below the threshold value, the signal at the output of comparator 31 changes from high to low. The control means 26 then begin to integrate downward in accordance with the above equation, for which the constant const. is used with a negative sign. This downward integration continues until either the smallest number value which is produced by the digital processor has been reached, or until the signal coming from comparator 31 changes back from low to high. As soon as this event occurs, the control means 26 change the integration direction and integrate upward. A downward integration denotes a weakening of the signal passing through the amplifier 24.

Since not only the useful signal part but also the noise part decreases accordingly, the subjective noise content of the total signal decreases at output 18, for example when the noise-disturbed channel 12a . . . 12e, which does not conduct any useful signal, has been weakened.

The amplification through amplifier 24 does not change suddenly but gradually in every instance, which effectively counteracts any pumping. The fading in or out of the audio signal part transmitted via the respective channel 12a . . . 12e is practically inaudible.

From the above equations it can further be seen that comparatively few real-time computer operations are required to achieve the desired success.

Finally, the system exhibits non-causal behavior due to the use of the delay means 21, insofar as it already begins to fade out the respective channel 12a ... 12e by decreasing the amplification even before an audible useful signal is no longer present in the respective channel 12a ... 12e, or vice versa it controls the channel 12a ... 12e upward before the useful signal appears, so that no useful signal is lost. The upward control of 12a ... 12e before the appearance of the useful signal has no meaning for the signal-to-noise ratio because of the time-related covering effect, but it improves the subjective tone quality.

Although the illustrated configuration example is predominantly explained in conjunction with a digital processor, it becomes clear that part of the advantages can also be achieved if an analog signal processor is used instead of the digital processor and the digital signal processing. With regard to the digital signal processing, the new noise suppression system has the advantage of making possible the use of an analog-digital or digital-analog converter for a given signal-to-noise ratio, which has fewer stages and is therefore clearly faster or more cost-effective.

The configuration example described in detail above represents the explanation of a system operating very effectively, because the noise is suppressed in narrow bands in which possibly no useful signal occurs, only noise. However, it can also be envisioned to omit the frequency-dividing network 5 and to transmit the entire audio frequency spectrum through a single channel. This channel then processes the spectrum between 30 Hz and 20 kHz, where the control only addresses the loudest signal and adjusts the channel for low sound, regardless of the frequency range in which the signal appears.

In a new circuit arrangement for improving the signal-to-noise ratio, the entire audio frequency spectrum is divided into several abutting frequency channels. In each channel the respective delayed signal part is supplied to an amplifier with controllable amplification. The amplifier's amplification is controlled as a function of a comparator, so that when the audio-frequency signal in the respective channel falls below a threshold value during a specified time, the amplification of the controllable amplifier is gradually decreased to the lowest amplification value. Vice versa, when the useful signal again exceeds the threshold value, the amplification is gradually controlled upward to a maximum value.

What is claimed is:

1. A circuit arrangement (1) for improving the signal-to-noise ratio of an audio signal, with at least one channel (12) which conducts at least part of the entire audible frequency spectrum or the entire audible frequency spectrum of the audio signal, and which comprises:
   (a) level measuring means (34) to detect a signal level in the channel (12) at time (t) and to produce a level signal for time (t+Δt) which is proportional to the signal level in the channel (12) at time (t),
   (b) comparison means (31) to compare the level signal with a limit value which is specific to the channel (12), and to produce a switch control signal which assumes a first value when the level signal exceeds the limit value, and which assumes a second value when the level signal falls below the limit value,
   (c) signal amplification means (24) containing an input (23) for feeding the audio signal part and an output (13) for providing the audio signal part to a downstream circuit, as well as an adjustable amplification for the audio signal part transmitted from the input (23) to the output (13), the signal amplification means being essentially continuously adjustable between a specified minimum amplification value and a specified maximum amplification value, by an amplification control signal supplied to the signal amplification means (24), and
   (d) control means (26) to which the switch control signal is fed, and which produce the amplification control signal for the pertinent signal amplification means (24) as a function of the amplification control signal, in such a way that after changing the condition of the switch control signal from the first to the second value, the amplification control signal gradually controls the amplification of the signal amplification means (24) in the direction toward minimum amplification, and maintains the amplification there as long as the second value is sustained, or after changing the condition of the switch control signal from the second into the first value, the amplification control signal gradually controls the amplification of the signal amplification means in the direction toward maximum amplification, and maintains the amplification there as long as the first value is sustained, characterized in that a delaying device (21) for the audio signal part in the respective channel (12) is located between the input (23) of the signal amplification means (24) and the input (35) of the level measuring means (34), said delaying device causing the audio signal received at the input (23) of the signal amplification means (24) to be delayed by an amount approximately equal to the length of time necessary to permit the gradual adjustment of the amplification control signal by the control means (26) to begin before the audio signal is received at the input (23).

2. A circuit arrangement as claimed in claim 1, characterized in that the signal amplification means (24) are feedforward controlled.

3. A circuit arrangement as claimed in claim 1, characterized in that the measuring means (34) are located before the signal amplification means (24).

4. A circuit arrangement as claimed in claim 1, characterized in that after a change in the condition of the switch control signal, the amplification of the signal amplification means (24) is changed according to an exponential function.

5. A circuit arrangement as claimed in claim 1, characterized in that the control means (26) operate as an integrator to change the amplification of the signal amplification means in a step-wise fashion.

6. A circuit arrangement as claimed in claim 1, characterized in that the audio signal at the input (35) of the level measuring means (34) is a digitalized signal.

7. A circuit arrangement as claimed in claim 1, characterized in that the audio signal at the input (19) of the delay means (21) is a digitalized signal.

8. A circuit arrangement as claimed in claim 1, characterized in that the level measuring means (34) are a programmed controlled digital processor.

9. A circuit arrangement as claimed in claim 1, characterized in that the signal amplification means (24) are a programmed controlled digital processor.

10. A circuit arrangement as claimed in claim 1, characterized in that the comparison means (31) are a programmed controlled digital processor.

11. A circuit arrangement as claimed in claim 1, characterized in that the control means (26) are a programmed controlled digital processor.

12. A circuit arrangement as claimed in claim 1, characterized in that the control means (26) and the signal amplification means (24) uses a combined program.

13. A circuit arrangement as claimed in claim 1, characterized in that the circuit arrangement uses fixed-point arithmetic to improve the signal to noise ratio of the audio signal.

14. A circuit arrangement as claimed in claim 1, characterized in that during computing operations the circuit arrangement has the ability of selectively not computing numbers which are smaller than a specified number.

15. A circuit arrangement as claimed in claim 1, characterized in that during computing operations the circuit arrangement has the ability of selectively not computing numbers which are larger than a specified number.

16. A circuit arrangement as claimed in claim 1, characterized in that the level signal is computed from the audio signal part in accordance with the following formula:

$$\text{level}_{(t+\Delta t)} = k * \text{level}_{(t)} + (1-k) * |\text{audio}_t|,$$

where:

$k = \exp(-t_{sample}/t_{integration})$ $t_{sample}$ = time distance between two sampling values $t_{integration}$ = integration time constant $\text{audio}_t$ = amplitude of the audio signal part at time t.

17. A circuit arrangement as claimed in claim 1, characterized in that the amplification of the signal amplification means are computed in accordance with the following formula:

$$\text{gain}_{(t+\Delta t)} = \text{scaler} * (\text{gain}_{(t)} + \text{const.}),$$

where:

$\text{scaler} = \exp(-t_{sample}/t_{scaler})$ $t_{sample}$ = time distance between two sampling values $t_{scaler}$ = integration time constant $\text{gain}_t$ = amplification factor at time t $\text{const} = (1/\text{scaler} - 1) * \text{minimum amplification}$.

18. A circuit arrangement as claimed in claim 17, characterized in that two different values are used for the scaler parameter, depending on whether the amplification is increased or decreased.

19. A circuit arrangement as claimed in claim 1, characterized in that frequency-dividing networks (5) are provided which divide the audible frequency spectrum into at least two audio frequency ranges (6 ... 11), and that a number of channels (12) corresponding to the audio frequency ranges obtained through the division is provided, to which the audio signal part that was obtained after the division is fed, where each frequency-dividing network contains:

(a) level measuring means (34) for detecting the level of a signal in the respective channel (12) at time (t), and for producing a level signal for time (t+Δt) which is proportional to the level of the signal in the respective channel (12) at time (t), (b) comparison means (31) for comparing the level signal with a limit value which is specific to the respective channel (12), and for producing a switch control signal which assumes a first value when the level signal exceeds the limit value, and which assumes a second value when the level signal falls below the limit value, (c) signal amplification means (24) containing an input (23) for feeding the audio signal part and an output (13) for providing the audio signal part to a downstream circuit, as well as an adjustable amplification for the audio signal part transmitted from the input (23) to the output (13), the signal amplification means being essentially continuously adjustable between a specified minimum amplification value and a specified maximum amplification value, by an amplification control signal supplied via the signal amplification means (24), and (d) control means (26) to which the switch control signal is fed, which produce the amplification control signal for the pertinent signal amplification means (24) as a function of the amplification control signal, in such a way that after changing the condition of the switch control signal from the first to the second value, the amplification control signal gradually controls the amplification of the signal amplification means (24) in the direction toward minimum amplification, and maintains the amplification there as long as the second value is sustained, or after changing the condition of the switch control signal from the second into the first value the amplification control signal gradually controls the amplification of the signal amplification means in the direction toward maximum amplification, and maintains it there as long as the first value is sustained, characterized in that a delaying device (21) for the audio signal part in the respective channel (12) is located between the input (23) of the signal amplification means (24) and the input (35) of the level measuring means (34), said delaying device causing the audio signal received at the input (23) of the signal amplification means (24) to be delayed by an amount approximately equal to the length of time necessary to permit the gradual adjustment of the amplification control signal by the control means (26) to begin before the audio signal is received at the input (23).

20. A circuit arrangement as claimed in claim 2, characterized in that the signal amplification means (24) are feedforward controlled.

21. A circuit arrangement as claimed in claim 19, characterized in that the measuring means (34) are located before the signal amplification means (24).

22. A circuit arrangement as claimed in claim 19, characterized in that after a change in the condition of the switch control signal, the amplification of the signal amplification means (24) is changed according to an exponential function.

23. A circuit arrangement as claimed in claim 2, characterized in that the control means (26) operate as an integrator.

24. A circuit arrangement as claimed in claim 2, characterized in that the audio signal at the input (35) of the level measuring means (34) is a digitalized signal.

25. A circuit arrangement as claimed in claim 2, characterized in that the audio signal at the input (19) of the delay means (21) is a digitalized signal.

26. A circuit arrangement as claimed in claim 2, characterized in that the level measuring means (34) are a programmed controlled digital processor.

27. A circuit arrangement as claimed in claim 2, characterized in that the signal amplification means (24) are a programmed controlled digital processor.

28. A circuit arrangement as claimed in claim 2, characterized in that the comparison means (31) are a programmed controlled digital processor.

29. A circuit arrangement as claimed in claim 2, characterized in that the control means (26) are a programmed controlled digital processor.

30. A circuit arrangement as claimed in claim 2, characterized in that the control means (26) and the signal amplification means (24) uses a combined program.

31. A circuit arrangement as claimed in claim 19, characterized in that the circuit arrangement uses fixed-point arithmetic to improve the signal to noise ratio of the audio signal.

32. A circuit arrangement as claimed in claim 19, characterized in that during computing operations the circuit arrangement has the ability of selectively not computing numbers which are smaller than a specified number.

33. A circuit arrangement as claimed in claim 2, characterized in that during computing operations the circuit arrangement has the ability of selectively not computing numbers which are larger than a specified number.

34. A circuit arrangement as claimed in claim 2, characterized in that the level signal is computed from the audio signal part in accordance with the following formula:

$$\text{level}_{(t+\Delta t)} = k * \text{level}_{(t)} + (1-k) * |\text{audio}_t|,$$

where:

$k = \exp(-t_{sample}/t_{integration})$
$t_{sample}$=time distance between two sampling values
$t_{integration}$=integration time constant
$\text{audio}_t$=amplitude of the audio signal part at time t.

35. A circuit arrangement as claimed in claim 2, characterized in that the amplification of the signal amplification means are computed in accordance with the following formula:

$$\text{gain}_{(t+\Delta t)} = \text{scaler} * (\text{gain}_{(t)} + \text{const.}),$$

where:

scaler=$\exp(-t_{sample}/t_{scaler})$
$t_{sample}$=time distance between two sampling values
$t_{scaler}$=integration time constant
$\text{gain}_t$=amplification factor at time t
const=(1/scaler−1)*minimum amplification.

36. A circuit arrangement as claimed in claim 35, characterized in that two different values are used for the scaler parameter, depending on whether the amplification is increased or decreased.

* * * * *

UNITED STATES PATENT AND TRADEMARK OFFICE
CERTIFICATE OF CORRECTION

PATENT NO.  : 6,005,953
DATED       : December 21, 1999
INVENTOR(S) : F. Stuhlfelner It is certified that error appears in the above-identified patent and that said Letters Patent is hereby corrected as shown below:

On the Title page, item [56]:Foreign Patent Documents section, the first document 0 599 132 A2 "of 0000" should read --of 6/1994--.

In claims 20, 23-30, 33, 34 and 35, please delete "as claimed in claim 2" and insert therefor --as claimed in claim 19--.

In Column 10, line 17, after "value" insert --,--.

Signed and Sealed this

Eighth Day of August, 2000

Attest:

Q. TODD DICKINSON

Attesting Officer

Director of Patents and Trademarks